United States Patent [19]

Hakata

[11] 4,051,356

[45] Sept. 27, 1977

[54] KEYBOARD CONTROLLED DATA CONVERTER

[75] Inventor: Masayuki Hakata, Iruma, Japan

[73] Assignee: Casio Computer Co., Ltd., Tokyo, Japan

[21] Appl. No.: 670,424

[22] Filed: Mar. 25, 1976

Related U.S. Application Data

[63] Continuation of Ser. No. 505,151, Sept. 11, 1974, which is a continuation of Ser. No. 299,823, Oct. 24, 1972, Pat. No. 3,855,459.

[30] Foreign Application Priority Data

Oct. 23, 1971  Japan .............................. 46-84187

[51] Int. Cl.$^2$ .............................................. G06F 5/00
[52] U.S. Cl. ............................ 235/310; 340/347 DD; 364/700
[58] Field of Search ......... 340/347 DD, 172.5, 365 S; 235/154, 155, 156, 160

[56] References Cited

U.S. PATENT DOCUMENTS 3,402,285  9/1968  Wang .................................. 235/156

Primary Examiner—Charles D. Miller
Attorney, Agent, or Firm—Flynn & Frishauf

[57] ABSTRACT

Apparatus for converting a data consisting of a data of a basic unit and a data of a unit other than the basic unit into a data of the basic unit comprises data input means, an operation unit connected to receive the output data from the data input means, memory means in which the output of the operating unit is set, unit indicating means for generating signals corresponding to respective units of the input data, and control means responsive to the signals generated by the unit indicating means, said control means including means for setting the input data in the memory means when the unit indicating means produces a signal corresponding to the basic unit of the input data, means for causing the operation unit to convert a unit of the input data other than the basic unit into a data of the basic unit when the unit indicating means produces a signal of a unit other than the basic unit, means for causing the operation unit to operate to add the converted data to the data which has been set in the memory means, and means for setting the result of the addition operation in the memory means.

1 Claim, 1 Drawing Figure

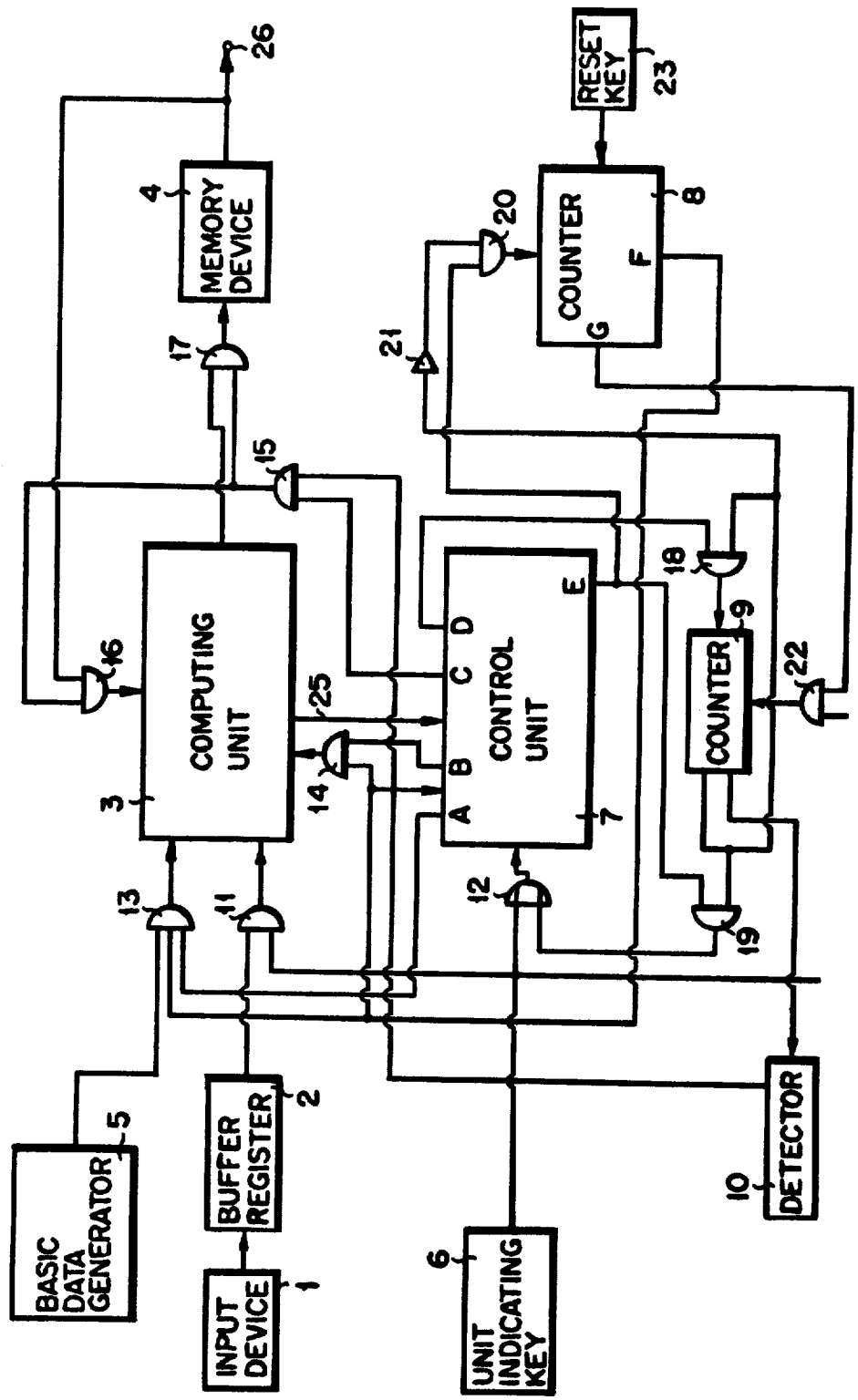

KEYBOARD CONTROLLED DATA CONVERTER

This is a continuation of application Ser. No. 505,151 filed Sept. 11, 1974, which is a Continuation of prior appln. Ser. No. 299,823 filed Oct. 24, 1972, now U.S. Pat. No. 3,855,459 issued Dec. 17, 1974.

BACKGROUND OF THE INVENTION

This invention relates to data converting apparatus suitable for use in an electronic desk top calculator, for example.

In a small size electronic computer such as an electronic desk top calculator it is desirable to perform computing operations with keys of as far as possible simple construction. However, in a large scale computer which should perform complicated operations it must process a plurality of digits of different unit. Thus for example in the computations of trigonometrical functions, periods and the results of surveys there are decimal numbers and scale of sixty numbers. For this reason, when computing these data it is necessary to apply them to an electronic computer, after they have been converted into numerical data of a single unit, ordinarily decimal values. In the computation of trigonometrical functions, for example, since degrees, minutes and seconds are expressed with different units it is necessary to convert minutes and seconds into degrees which are decimal values. In such a case, during a series of operations, in order to convert scale of sixty values into decimal values it is necessary to clear the result of previous operation and previous order so that the operation is greatly complicated.

Where an operation of (a+b) (30° 45′ 9″), for example, is to be performed by a conventional electronic desk top calculator the following key operations should be made.

| a |  | | | |
|---|---|---|---|---|
| b |  |  | | |
| |  | | | |
| 30 |  | | | |
| 45 |  | 60 |  |  |
| 9 |  | 3600 |  |  |
| |  |  |  |  |

Above described keys are termed as follows.

 equal-plus key

 first memory storing key

 second memory storing key

 clear key

 division key

 multiplication key

 first memory call key

 second memory call key

As can be clearly understood from the above described example, this operation requires not only to clear previous result of operation as well as previous order but also to perform extremely complicated and inconvenient operations.

SUMMARY OF THE INVENTION

Accordingly, it is an object of this invention to provide an improved data converting apparatus suitable for use in a small size computer, such as an electronic desk top calculator and capable of readily performing operations of extremely complicated scientific data by simple key operations.

Another object of this invention is to provide a new and improved data converting apparatus capable of readily and rapidly converting various data consisting of data of different units, such as data representing angles, lengths and periods, into data of a single unit thereby enabling a computer associated with the data converting apparatus to readily compute such data consisting of data of different units without the necessity of clearing the result of previous operation as well as the previous order.

According to this invention, these and other objects can be accomplished by providing data converting apparatus comprising data input means, the data consisting of a data of a basic unit and a data of a unit other than the basic unit, an operation unit connected to receive the output data from the data input means, memory means in which the output of the operation unit is set, unit indicating means for generating signals corresponding to respective units of the input data, and control means responsive to the signals generated by the unit indicating means, said control means including means for setting the input data in the memory means when the unit indicating means produces a signal corresponding to the basic unit of the input data, means for causing the operation unit to convert a unit of the input data other than the basic unit into a data of the basic unit when the unit indicating means produces a signal of the unit other than the basic unit, means for causing the operation unit to operate to add the converted data to the data which has been set in the memory unit, and means for setting the result of the addition operation in the memory means.

BRIEF DESCRIPTION OF THE DRAWING

Further objects and advantages of the invention will be more fully understood from the following detailed description taken in conjunction with the accompanying drawing in which a single FIGURE shows a block diagram of one example of the data converting apparatus embodying the invention.

DESCRIPTION OF THE PREFERRED EMBODIMENT

A preferred embodiment illustrated in the accompanying drawing comprises an input device 1 including digit keys for digits 0 to 9, an equal-plus key, a clear key, a division key, a multiplication key, a memory key and the like, a buffer register 2 in which the data applied by input device 1 is set, a computer unit 3, a memory device 4, a basic data generator 5 which generates a basic data of a scale of n, for example, a numerical value of 60 as the basic data of a scale of sixty, and a unit indicating key 6 of the unit indicating device which is included in the input device 1. There is provided a control unit 7 constructed to generate a predetermined signals in the order of A-B-C-D-E from its output terminals A, B, C, D and E when it receives a drive signal through an OR gate 12. A first counter 8 is provided to produce an output corresponding to its count and is provided with an output terminal F producing a signal whose level becomes "0" when the content is equal to zero and "1" when the content equals other than zero, and an output terminal G which produces the number of counts. A second counter 9 produces a signal whose level becomes "0" when its count equals zero whereas "1" when the count increases beyond one. Associated with the second counter 9 is a detector 10 which produces an output signal whose level becomes "1" when the content of the second counter 9 equals zero or one, whereas "0" when the count increases beyond two.

Assuming an input data of 30° 45' 9" for computing a triangular function, the illustrated data converting apparatus operates as follows. Let us take a degree as the reference unit. Then a numerical value 30 representing the unit of degrees will be applied to the input device without any conversion. Then the unit indicating key 6 is operated to apply a unit indicating signal to an AND gate circuit 11 for supplying the data 30 to the operation unit 3 via buffer register 2 and AND gate circuit 11. At the same time, the unit indicating signal is also applied to control unit 7 through OR gate circuit 12 to act as a drive signal for starting the operation of the control unit. When the control unit starts to operate an output from its output terminal A is applied to AND gate circuit 13. By this time, since this AND gate circuit 13 has been disenabled by the "0" level signal from the output terminal G of the first counter 8, data 60 from basic data generator 5 would not be applied to operation unit 3. When an output signal is produced at terminal B of control unit 7 a predetermined time after the appearance of the signal at terminal A, the signal at terminal B is applied to an AND gate circuit 14 as an operation order signal. Since by this time AND gate circuit 14 has been disenabled by the "0" signal from the output terminal F of the first counter 8, the operation order signal would not be applied to the operation unit 3. When an output signal appears at the output terminal C of control unit 7 and when the output from the output terminal F of the counter 8 is "0", the control unit 7 produces an output at its terminal C. The output from the terminal C is impressed upon an AND gate circuit 15 to act as an addition transfer order signal. Since, at this time AND gate circuit 15 has been enabled by the "1" signal from detector 10, the addition transfer order signal will be applied to AND gate circuits 16 and 17. Since by this time no data has been stored in the memory device 4, no data will be supplied to the operation unit 3 from the memory device 4 so that any operation (addition) will not be performed. Thus, the data 30 in the operation unit 3 is stored in the memory device 4 without being subjected to any processing. When an output signal appears on output terminal D of control unit 7 a predetermined time after appearance of the signal at output terminal C the signal at terminal D will be impressed on an AND gate circuit 18. At this time, however, the AND gate circuit 18 is still disenabled because the content of the second counter 9 is zero. When an output signal appears at output terminal E of control unit 7 a predetermined time after appearance of the output signal at the output terminal D, the signal at terminal E will be applied to an AND gate circuit 19. But at this time the AND gate circuit 19 has been disenabled by the "0" signal from the second counter 9. The output signal from output terminal E is also supplied to AND gate circuit 20. Since AND gate circuit 20 has been enabled by an "1" signal which is produced by inverting the "0" signal from the second counter 9 by means of an inverter 21, AND gate circuit 20 operates to supply a signal to the first counter 8 thus changing its content to one. Whereupon the level of the output signal from terminal F of the first counter 8 is changed to "1" and this signal is impressed upon AND gate circuits 13 and 14 thus enabling the same.

When data 45 of the unit of "minute" is applied to input device 1 and when the unit indicating key 6 is operated, similar to data 30, this data 45 is also applied to the operation unit 3 to commence the operation of the control unit 7. The signal from unit indicating key 6 is also supplied to an AND gate circuit 22 for enabling the same. When enabled in this manner, AND gate circuit 22 applies the content one of the first counter 8 to the second counter 9 through output terminal G to change the content of the second counter 9 to one thus changing its output signal to "1". When the output signal from the second counter 9 changes to "1" AND gate circuit 18 is enabled. Application of the signal from output terminal A of the control unit 7 enables AND gate 13 since the "1" signal from the first counter 8 is also being applied to this AND gate circuit whereby the basic data 60 from the basic data generator 5 is coupled to the operation unit 3 via AND gate circuit 13. Then, when the output signal from output terminal B is impressed upon AND gate circuit 14 this signal will be supplied to the operation unit 3 to act as an operation order signal because the AND gate circuit 14 has been enabled by the "1" signal from the output terminal of the first counter 8. Upon application of this operation order signal, the operation unit 3 functions to divide data 45 with data 60 thus converting the data 45 expressed by the unit of minutes into 45/60°, that is a decimal data of the unit of degree. When an operation termination signal is provided on a signal conductor 25 by the operation unit 3, the output signal from the output terminal of the control unit 7 will be applied to AND gate circuit 15. Since this AND gate circuit has been enabled by the output from detector 10, the output signal from the output terminal C of the control unit 7 will be applied to AND gate circuits 16 and 17 to act as an addition transfer order signal, thus enabling AND gate circuits 16 and 17. Whereupon, data 30 which has been stored in the memory device 4 as the result of the previous operation is supplied to the operation unit 3 to be added to the result of said operation and the result of addition is transferred back to the memory device 4. In other words, the data 45/60 in terms of the unit of degree is added to data 30 in the memory device 4. Thereafter an output signal from the output terminal D of the control unit 7 is impressed upon AND gate circuit 18. At this time, since this AND gate circuit is in the enabled state, the signal from the output terminal D will be supplied to the second counter 9 thereby shifting its content by minus one. As a result, the content of this counter 9 again becomes zero to change its output signal to "0", thereby disenabling the AND gate circuit 18. Then the signal from the output terminal E of the control unit 7 is impressed upon AND gate circuit 19, but this AND gate circuit 19 has been maintained in its disenabled state by the signal "0" from the second counter 9. The output signal from output terminal E of the control unit 7 and the negation signal or the "1" signal from the second counter 9 are applied to the first counter 8 through an AND gate circuit 20 thus changing the content of the first counter 8 to two which appears on its output terminal G.

Then a numerical data 9 of the unit of second is applied by the input device and the unit indicating key 6 is operated. Under these conditions, similar to the previous operation, the numerical data 9 is supplied to the operation unit 3 while at the same time the control unit 7 commences to operate. The signal from unit indicating key 6 is applied to an AND gate circuit 22 thereby enabling the same. When the AND gate circuit 22 is enabled, the content two of the first counter 8 is supplied to the second counter 9 through the output terminal of the first counter 8 thereby changing the content of the second counter 9 to two. As a result, the second counter 9 provides an output signal "1" thereby enabling AND gate circuits 18 and 19. At the same time the detector 10 provides an output signal "0" thus disenabling the AND gate circuit 15. The signal from the output terminal A of the control unit 7 functions to supply the numerical data 60 from the basic data generator 5 to the operation unit 3 and the operation of the numerical data 60 and the "second" data 9 are operated by the signal from the output terminal B of the control unit 7. More particularly, at first the "second" data 9 is converted into a data of the unit of minute, that is 9/60. When an operation termination signal is supplied to the control unit 7 from the operation unit 3 over the signal conductor 25, a signal is produced at the output terminal C of the control unit 7. Under these conditions, since AND gate circuit 15 is disenabled no addition operation is performed in the operation unit 3 and hence no data is transferred from the operation unit 10 to memory device 4. A signal produced at output terminal D of the control unit 7 is applied to the second counter 9 through AND gate circuit 18 and the content of the second counter 9 is shifted by −1, thus changing the content thereof from two to one. Then the detector 10 produces an output signal "1", thus enabling AND gate circuit 15. A signal produced next time on output terminal E is impressed upon AND gate circuit 19. Since this AND gate circuit has been enabled by the "1" signal from the second counter 9 the signal from the output terminal E of the control unit 7 will be applied to the control circuit 7 as the drive signal via AND gate circuit 19 and OR gate circuit 12 to resume the operation of the control unit 7. At this time, the signal from the output terminal E is applied to AND gate circuit 20 but since this AND gate circuit has been disenabled by a "0" signal produced by inverting "1" signal from the second counter 9 by means of inverter 21 no signal will be impressed upon the first counter 8 whereby the content of the first counter 8 is maintained at two.

Numerical data 60 is supplied to the operation unit 3 from the basic data generator 5 under the control of the signal from the output terminal A of the control unit 7. Then the operation order signal from the output terminal B performs a division operation of 9/60 ÷ 60 = 9/3600 between the data 60 from the basic data generator 5 and the "second" data that has been converted into a data of the unit of minute, that is 9/60, thus forming a data of the unit of degree. Where an operation termination signal is applied over the signal conductor 25, the control unit 7 produces a signal at its output terminal C in response to the operation termination signal. At this time since AND gate circuit 15 is enabled the signal produced at terminal C is impressed upon the AND gate circuits 16 and 17 thereby enabling the same. As a result the degree data (30 + 45/60) that has been stored in memory device 40 will be supplied to operation unit 3 to be added to data 9/3600, and the result of operation, that is a degree data (30 + 45/60 + 9/3600) is transferred to the memory device 4. Then, a signal is produced at the output terminal D of the control unit 7 thus shifting the content of the second counter 9 by −1. Accordingly, the content of this counter is again brought to zero whereby the second counter produces a "0" signal thus disenabling AND gate circuits 18 and 19. Then, a signal from output terminal E is applied to AND gate circuits 19 and 20, these gate circuits being in their disenabled state.

When the signal is produced at the output terminal E, the process of converting the units is completed so that a reset key 23 is operated to reset the first counter 8 to the original state to prepare for the next cycle of operation. When all processings of the data are completed, data 30° 45′ 9″ which was converted into the decimal data of the unit of degrees, that is data (30° + 45/60 + 9/3600) degrees is set in the memory device 4. This data stored in the memory device 4 is sent to the succeeding processing device (not shown) through an output terminal 26.

As above described, according to this invention it is possible to readily and rapidly convert data of a trigonometrical function including both decimal digits and scale of 60 digits into a numerical data of one unit, for example, unit of degree. Moreover, it is possible to operate data of different units by a simple key operation similar to that of ordinarily arithmetic operations without the necessity of clearing the result of previous operation and previous order. The following table shows a comparison of key operations of an electronic desk top calculators embodying and not embodying the invention. It is assumed that the data 30° 45′ 9″ is to be operated.

Key Operation of the Prior Art

30   [M]

45   [÷]   60   [=/+]   [M]

-continued

| 9 | [÷] | 3600 | [=/+] | [M] | [RM] |

Key Operation of This Invention

| 30 | [IND] |
| 45 | [IND] |
| 9  | [IND] | where [IND] represents the unit indicating key.

The key operation where an equation $(a + b)(30° 45' 9'')$ is to be computed is as follows

| a | [=/+] |
| b | [=/+] |
|   | [×]   |
| 30 | [IND] |
| 45 | [IND] |
| 9  | [IND] |
|    | [=/+] |

It can be readily understood that the key operation of this invention is much simpler than that of the prior art. In other words, this invention enables extremely rapid operations of complicated scientific data.

Although in the above example, a data of a trigonometrical function containing different units of degree, minute and second was converted into a decimal data of a single unit of degree it is also possible to convert it into a decimal data of a unit of minute or second. Thus, it is possible to use any desired basic unit. Although the numerical data of the output from the basic data generator 5 is 60 where it is intended to convert a scale of sixty data into a decimal data, in order to convert a numerical value representing a length, for example a data including the units of inch and yard into a data of the unit of yard, the basic data generator 5 is modified to generate a basic data 12. More particularly, instead of using a single basic data generator it is also possible to provide a plurality of basic data generators generating different basic data for selectively connecting one of these basic data generators to the operation unit depending upon the type of the input data.

What is claimed is:

1. Apparatus for converting input data expressed in units of scale-of-$m$ into data expressed in units of scale-of-$n$, comprising:

data input means supplying data expressed in a basic unit of scale-of-$n$ and data expressed in another unit of scale-of-$m$;

unit indicating means including a unit indication input key operated according to the unit of said data input;

means coupled to said unit indication input key for generating signals corresponding to the respective unit of said input data in accordance with the number of operations of said unit indication input key when the data expressed in the basic unit of scale-of-$n$ and data expressed in the other unit of scale-of-$m$ are supplied to said unit indicating means;

data generating means for generating basic data used to convert said data expressed in the other units of scale-of-$m$ to data expressed in the basic units of scale-of-$n$;

an operation unit connected to receive the data from said data input means and the basic data from said data generating means;

memory means for storing the output of said operation unit; and control means responsive to the signals generated by said unit indicating means, said control means including means for storing said input data in said memory means when said unit indicating means produces a signal corresponding to the basic unit of said input data, means for causing said operation unit to convert the input data which is expressed in any other unit than said basic unit into data of said basic unit when said unit indicating means produces a signal indicating that the input data is expressed in said other unit, means for causing said operation unit to add said converted data to said data which has been stored in said memory means, and means for storing the result of said addition in said memory means.

* * * * *